United States Patent
Ono et al.

(10) Patent No.: US 11,404,255 B2
(45) Date of Patent: Aug. 2, 2022

(54) SPUTTERING METHOD AND SPUTTERING APPARATUS

(71) Applicant: Tokyo Electron Limited, Tokyo (JP)

(72) Inventors: Kazunaga Ono, Yamanashi (JP); Atsushi Gomi, Yamanashi (JP); Tatsuo Hatano, Yamanashi (JP); Yasuhiro Otagiri, Yamanashi (JP); Tomoyuki Fujihara, Yamanashi (JP); Yuuki Motomura, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/015,170

(22) Filed: Sep. 9, 2020

(65) Prior Publication Data

US 2021/0082675 A1 Mar. 18, 2021

(30) Foreign Application Priority Data

Sep. 18, 2019 (JP) .............................. JP2019-169051

(51) Int. Cl.
*H01J 37/34* (2006.01)
*H01L 21/203* (2006.01)
*C23C 14/34* (2006.01)

(52) U.S. Cl.
CPC ...... *H01J 37/3447* (2013.01); *C23C 14/3464* (2013.01); *H01J 37/3426* (2013.01); *H01L 21/203* (2013.01)

(58) Field of Classification Search
None
See application file for complete search history.

(56) References Cited

U.S. PATENT DOCUMENTS

2005/0199490 A1* 9/2005 Nomura .............. C23C 14/3464
                                              204/298.11
2010/0213047 A1* 8/2010 Nagamine ............... H01L 43/12
                                              204/192.12

FOREIGN PATENT DOCUMENTS

JP        2013-249517 A      12/2013

* cited by examiner

*Primary Examiner* — Jason Berman
(74) *Attorney, Agent, or Firm* — Venjuris, P.C.

(57) ABSTRACT

A sputtering method including: performing a pre-sputtering by emitting sputter particles from a target provided in a sputtering apparatus in a state where the target is shielded by a shielding portion of a shutter provided closed to the target to be capable of opening/closing the target; and, after the pre-sputtering, performing a main-sputtering by emitting the sputter particles from the target in a state where an opening of the shutter is aligned with the target thereby depositing the sputter particles on a substrate. When the pre-sputtering and the main-sputtering are repeatedly performed, a shutter position is changed during the pre-sputtering so as to change a position of the shielding portion aligned with the target.

20 Claims, 11 Drawing Sheets

| STEP | 1 | 2 | 3 | 4 | 5 |
|---|---|---|---|---|---|
| SHUTTER STATE | Gas in | Ignition | PreSP1 | PreSP2 | Depo |
| SHUTTER POSITION | CLOSE | CLOSE (Multi) | CLOSE (Multi) | CLOSE | OPEN |
| |  |  |  |  |  |
| | | CLEANING OF TARGET SURFACE | | CONDITIONING | |
| | | | DEPOSITION ON SHUTTER | | DEPOSITION ON SUBSTRATE |

SPUTTERING METHOD AND SPUTTERING APPARATUS

CROSS-REFERENCE TO RELATED APPLICATIONS

This application is based on and claims priority from Japanese Patent Application No. 2019-169051 filed on Sep. 18, 2019 with the Japan Patent Office, the disclosure of which is incorporated herein in its entirety by reference.

TECHNICAL FIELD

The present disclosure relates to a sputtering method and a sputtering apparatus.

BACKGROUND

Sputtering that deposits sputter particles from a target on a substrate has been widely used as a film forming technique. For example, Japanese Patent Laid-Open Publication No. 2013-249517 discloses a sputtering apparatus that forms a predetermined film by sputtering and includes two targets made of different materials, respectively, and a shutter configured to shield one target while the other target is exposed for sputtering. The shutter is provided close to the targets to prevent the particles from one target from being adhered to the other target (cross-contamination).

Further, in the sputtering apparatus, a pre-sputtering is performed in a state where the target is shielded by the shutter, and then, the shutter is opened (the target is exposed) and a main-sputtering is performed to form a film on a substrate. In the case of having two targets such as Japanese Laid-Open Publication No. 2013-249517, the same operation is performed for the other target. Such an operation is repeatedly performed for processing a plurality of substrates.

SUMMARY

An aspect of the present disclosure is a sputtering method by a sputtering apparatus including a target, and a shutter provided close to the target to be capable of opening/closing the target. The method includes: performing a pre-sputtering by emitting sputter particles from the target in a state where the target is shielded by a shielding portion of the shutter; and after the pre-sputtering, performing a main-sputtering in which sputter particles are emitted from the target to be deposited on a substrate in a state where an opening of the shutter is aligned with the target. When the pre-sputtering and the main-sputtering are repeatedly performed, a shutter position is changed during the pre-sputtering so as to change a position of the shielding portion aligned with the target.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments will be described.

Figure 1:
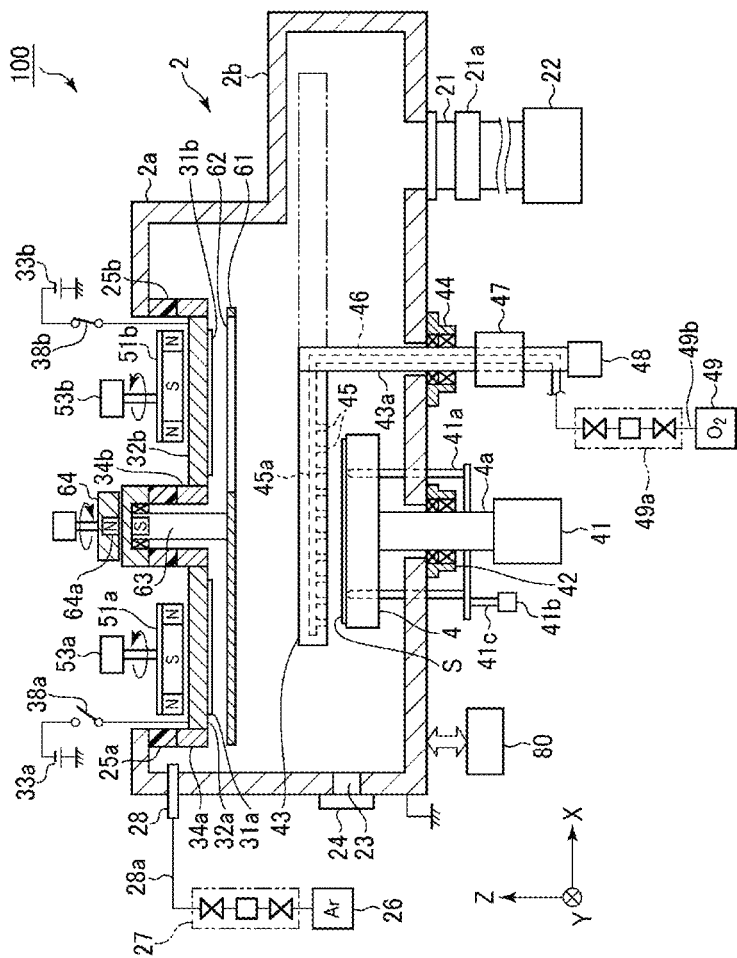
FIG. 1 is a cross-sectional view illustrating a sputtering apparatus according to an embodiment.
Figure 2:
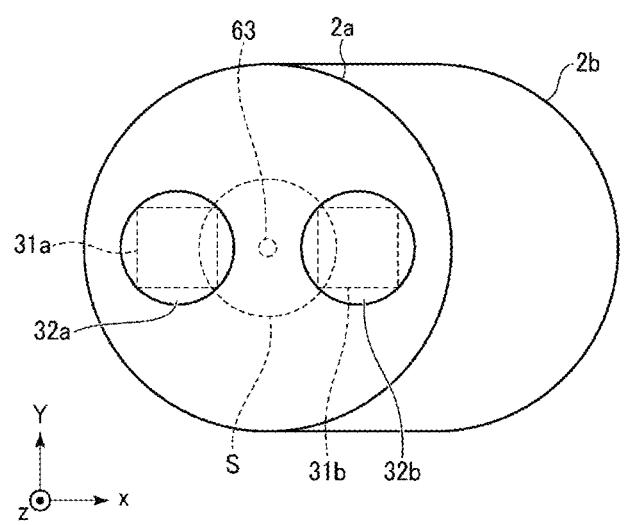
FIG. 2 is a plan view illustrating the sputtering apparatus according to the embodiment.

FIG. 1 is a cross-sectional view illustrating a sputtering apparatus according to an embodiment, and FIG. 2 is a plan view thereof.

As illustrated in FIG. 1, the sputtering apparatus 100 includes a vacuum container 2 that is made of conductive material, for example, stainless steel, and is grounded. The vacuum container 2 includes a cylindrical portion 2a and a protrusion portion 2b that is protruded laterally (x direction in the drawing) from the cylindrical portion 2a.

A first target electrode 32a and a second target electrode 32b that have a circular shape and have the same size are disposed side by side in the horizontal direction (x direction in the drawing) on a ceiling of the cylindrical portion 2a. The first and second target electrodes 32a and 32b are joined to ring-shaped insulators 25a and 25b through ring-shaped holding bodies 34a and 34b, respectively. The insulators 25a and 25b are joined to the ceiling of the vacuum container 2. Therefore, the first and second target electrodes 32a and 32b are placed at a position that is sunk downward from an upper surface of the cylindrical portion 2a in a state of being electrically insulated from the vacuum container 2.

A first target 31a is joined to a lower surface of the first target electrode 32a, and a second target 31b is joined to a lower surface of the second target electrode 32b, respectively. The first and second targets 31a and 31b have, for example, a rectangular shape such as a square, and have substantially the same size.

Figure 3:
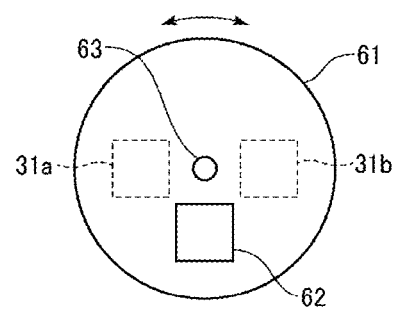
FIG. 3 is a bottom view illustrating a shutter used in the sputtering apparatus according to the embodiment.

A shutter 61 is provided immediately below the first and second targets 31a and 31b. FIG. 3 is a bottom view of the shutter 61 viewed from a lower side. As illustrated in FIG. 3, the shutter 61 is a circular plate having a size that covers projection regions of both the first and second targets 31a and 31b, and is rotatably attached to the center of the upper surface of the cylindrical portion 2a via a rotary shaft 63. The shutter 61 is provided with a rectangular opening 62 having a size slightly larger than the first and second targets 31a and 31b, and the portion of the shutter 61 other than the opening 62 serves as a shielding portion. The first target 31a and the second target 31b are shielded when covered by the shielding portion of the shutter 61, and are opened when aligned with the opening 62. Then, when the opening 62 is positioned in a region facing one of the first target 31a and the second target 31b, the other is covered by the shutter 61. Therefore, the particles knocked and released outside while one target is sputtered are prevented from adhering to the other target. As will be described later, pre-sputtering for cleaning is performed on the target that is covered with the shielding portion of the shutter 61.

Two shutters 61 may be used in an overlapping manner, and a plurality of openings 62 may be provided for one shutter 61.

A shutter rotating driving unit 64 having a magnet 64a is provided at a position aligned with the rotary shaft 63 above the ceiling of the vacuum container 2, and the rotary shaft 63 is rotated by the magnetic coupling between the magnet 64a and the magnet provided on the rotary shaft 63 side, and accordingly, the shutter 61 is rotated.

The first and second target electrodes 32a and 32b are connected to power sources 33a and 33b, respectively, and for example, are configured such that a negative DC voltage is applied thereto. Switches 38a and 38b are interposed between the first target electrode 32a and the power source 33a, and between the second target electrode 32b and the power source 33b, respectively.

The materials of the first target 31a and the second target 31b are not particularly limited, and are appropriately set according to the material of the film to be formed. In the present example, a case where a metal film is formed, and then an oxide film is formed by an oxidation treatment is illustrated, and a material suitable for the target is applied to each target. The material of the first target 31a may include, for example, titanium (Ti), chromium (Cr), tantalum (Ta), zirconium (Zr), magnesium (Mg), hafnium (Hf), or alloys thereof. The materials function as members that absorb oxygen or water (hereinafter, referred to as "gettering members"). Meanwhile, the material of the second target 31b may include, for example, a metal such as magnesium (Mg), aluminum (Al), nickel (Ni), gallium (Ga), manganese (Mn), copper (Cu), silver (Ag), and zinc (Zn), or Hf. The materials function as film forming materials on a substrate S.

A stage 4 on which the substrate S is horizontally placed is provided in the vacuum container 2, so as to face the first and second targets 31a and 31b. The substrate S is not particularly limited, but, for example, a semiconductor wafer having a semiconductor base such as silicon may be used. The stage 4 is connected to a driving mechanism 41 disposed below the vacuum container 2 through a shaft member 4a. The driving mechanism 41 has a role of rotating the stage 4, and moving up and down the stage 4 between a position where the substrate S is delivered to and from an external transfer mechanism (not illustrated) via a raising/lowering pin 41a and a processing position at the time of sputtering. The reference numeric 42 indicates a sealing. A heating mechanism (not illustrated) is incorporated in the stage 4, and is configured to heat the substrate S at the time of sputtering. Three raising/lowering pins 41a are provided to support the lower surface of the substrate S at three points, and move up via a support member 41c by a raising/lowering unit 41b.

Magnet arrays 51a and 51b are provided above the first and second target electrodes 32a and 32b to be close thereto, respectively. The magnet arrays 51a and 51b are configured by arranging an N-pole magnet group and an S-pole magnet group on a highly magnetically permeable material (e.g., an iron (Fe)) base body such that the N-pole and the S-pole are arranged in a matrix form.

The magnet arrays 51a and 51b are disposed at positions biased from the centers of the first and second targets 31a and 31b, respectively, and are configured to be rotated around the centers of the targets 31a and 31b by rotating mechanisms 53a and 53b. As described above, it is possible to enhance the uniformity of erosion by disposing the magnet arrays 51a and 51b at the positions biased from the centers of the first and second targets 31a and 31b.

A circular cover plate 43 functioning as a shielding member that shields the substrate S is provided inside the vacuum container 2. The cover plate 43 has a circular shape larger than the size of the substrate S. A column 43a extending vertically is connected to the outer periphery of the cover plate 43, and the cover plate 43 is configured to be horizontally rotatable about the column 43a between a shielding position that covers the substrate S and a retracted position that is retracted from the position that covers the substrate S. The column 43a penetrates the bottom of the vacuum container 2, and is rotatably supported by a rotating support 48 via a cover plate rotating driving unit 47. The reference numeric 44 indicates a sealing mechanism. An example of the cover plate rotating driving unit 47 is a belt driving in which the rotation of a motor is transmitted by a belt to rotate the column 43a, but the present disclosure is not limited thereto.

Figure 4:
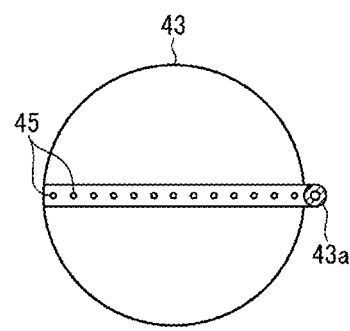
FIG. 4 is a bottom view illustrating a cover plate used in the sputtering apparatus according to the embodiment.

In the embodiment, the cover plate 43 has a function of supplying oxygen ($O_2$) to the substrate S, in addition to the shielding function described above. Specifically, as illustrated in FIG. 4, a plurality of gas ejecting holes 45 is formed in the lower surface of the cover plate 43 along the diametrical direction. A gas flow path 45a that communicates with the gas ejecting holes 45 is horizontally formed inside the cover plate 43. A gas flow path 46 that communicates with the gas flow path 45a is vertically formed inside the column 43a. The gas flow path 46 is connected to one end of a gas supply pipe 49b, and an oxygen gas supply source 49 is connected to the other end of the gas supply pipe 49b. The portion of the gas supply pipe 49b on the downstream side is configured as a flexible tube so as to be aligned with the rotation of the column 43a. A gas controller group 49a constituted by a valve or a flow meter is provided in the gas supply pipe 49b. The oxygen gas from the oxygen gas supply source 49 is ejected from the gas ejection holes 45 through the gas supply pipe 49b and the gas flow paths 46 and 45a.

For example, a heater (not illustrated) is provided in the cover plate 43 as a temperature adjusting mechanism, and the oxygen gas in the gas flow path 45a is preheated by the heater. The heater may be provided not only in the cover plate 43, but may be provided in the column 43a or may be provided in both.

An exhaust port 21 is connected to the bottom of the vacuum container 2, and the exhaust port 21 is connected to a pressure control valve 21a and a vacuum exhaust device 22. The inside of the vacuum container 2 is exhausted by the vacuum exhaust device 22, and the pressure is controlled by the pressure control valve 21a, and thus, the inside of the vacuum container 2 may be set to a predetermined vacuum pressure.

A carry-in/out port 23 configured to carry in/out the substrate S, and a gate valve 24 configured to open/close the carry-in/out port 23 are provided in the side surface of the vacuum container 2.

A gas introducing nozzle 28 configured to introduce an inert gas serving as a plasma generating gas, for example, an Ar gas into the vacuum container 2 is inserted in the upper side wall of the vacuum container 2 to penetrate into the vacuum container 2, and one end of a gas supply path 28a is connected to the gas introducing nozzle 28. The other end of the gas supply path 28a is connected to an inert gas supply source 26. Then, an inert gas, for example, an Ar gas is supplied from the inert gas supply source 26 into the vacuum container 2 through the gas supply path 28a and the gas introducing nozzle 28. A gas controller group 27 constituted by a valve or a flow meter is provided in the gas supply path 28a. The inert gas supply source 26, the gas supply path 28a, and the gas introducing nozzle 28 constitute an inert gas supply mechanism.

The first and second target electrodes 32a and 32b, the power sources 33a and 33b, the magnet arrays 51a and 51b, and the inert gas supply mechanism constitute a sputter particle emitting mechanism.

Figure 5:
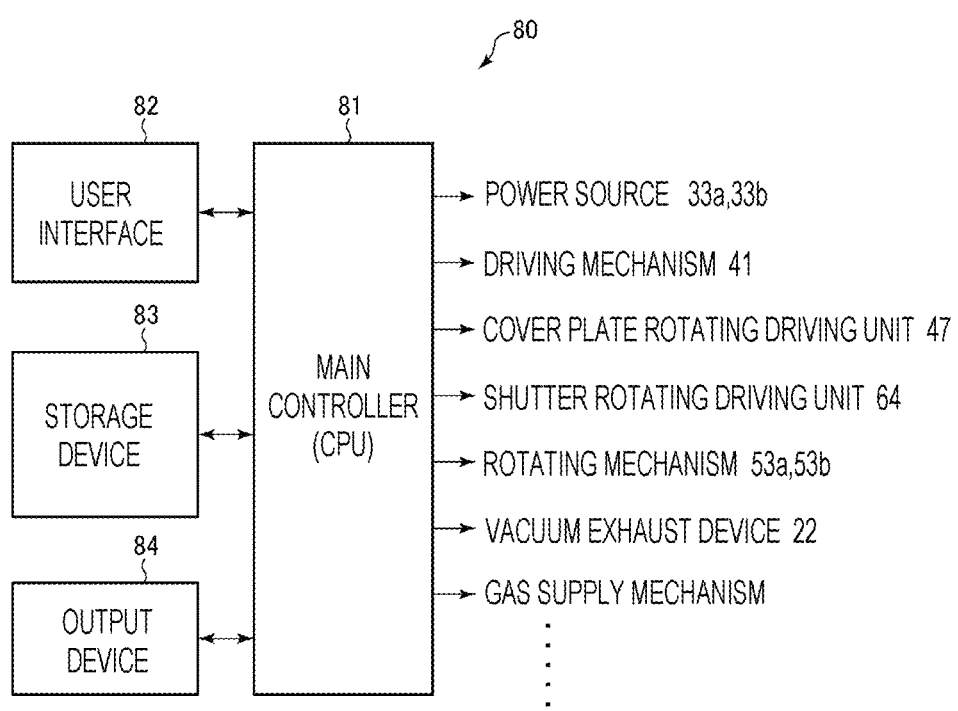
FIG. 5 is a block diagram illustrating a controller used in the sputtering apparatus according to the embodiment.

The sputtering apparatus 100 further includes a controller 80. As illustrated in FIG. 5, the controller 80 includes a main controller 81, a user interface 82, and a storage device 83, and an output device 84.

The main controller 81 includes a CPU, and controls each component of the sputtering apparatus 100, for example, the power sources 33a and 33b, the driving mechanism 41, the cover plate rotating driving unit 47, the shutter rotating driving unit 64, the rotating mechanisms 53a and 53b, the vacuum exhaust device 22, and the gas supply mechanism configured to supply an Ar gas or an O₂ gas.

The user interface 82 is connected to the main controller 81, and includes, for example, a keyboard for an operator to perform an input operation of commands to manage each component of the sputtering apparatus 100, or a display that visualizes and displays the operating status of each component of the sputtering apparatus 100.

The storage device 83 incorporates a storage medium such as a hard disk, and data necessary for controlling is stored in the storage medium. Further, the storage device 83 is configured to be capable of setting a portable storage medium in which data for control of, for example, a CD, a DVD or a flash memory is stored. In the storage medium, for example, a recipe for performing control of the operation of the sputtering apparatus 100, or other data for performing the operation of the sputtering apparatus 100 is stored.

Figure 6:
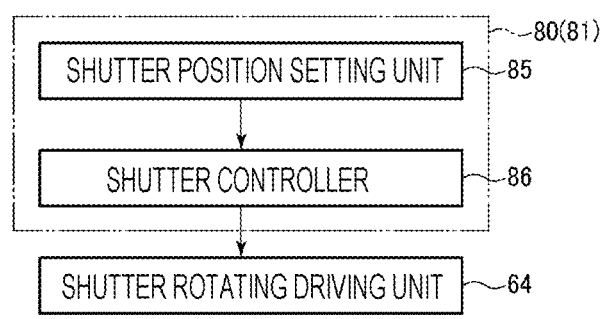
FIG. 6 is a block diagram illustrating a characteristic part of the controller in FIG. 5.

The main controller 81 causes the sputtering apparatus 100 to perform a predetermined operation based on the processing recipe called from the storage medium of the storage device 83. Particularly, the embodiment is characterized in that the controller 80 controls the operation of the shutter rotating driving unit 64 that rotates the shutter 61. Specifically, as illustrated in FIG. 6, the controller 80 (main controller 81) includes a shutter position setting unit 85 and a shutter controller 86, and the shutter controller 86 controls the shutter rotating driving unit 64 such that the shutter 61 is in the set position.

Figure 7:
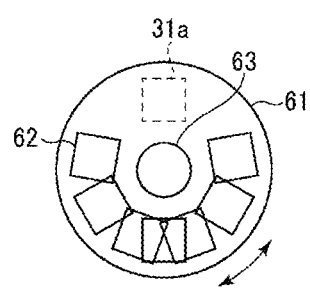
FIG. 7 is a schematic view illustrating an example of a setting of a shutter position.

Specifically, when one target 31a or 31b is covered with the shutter 61 and the target is supplied with power from the power source 33a or 33b to perform pre-sputtering, a plurality of positions of the shutter 61 may be set. At each set position of the shutter 61, the position aligned with the target in the shielding portion of the shutter 61 other than the opening 62 is different. In the example in FIG. 7, the number of the set position of the shutter 61 is seven.

The shutter position setting unit 85 sets the position of the shutter 61 based on, for example, the input operation on the user interface 82 by an operator. Then, the shutter controller 86 controls the shutter rotating driving unit 64 based on the setting of the shutter position setting unit 85. Therefore, the shutter 61 is rotated (swung) around the rotary shaft 63, and positioned at the set position among the plurality of settable positions. In the processing of a plurality of substrates S, the setting of the position of the shutter 61 is changed and pre-sputtering is performed. Therefore, the position aligned with the target in the shielding portion of the shutter 61 other than the opening 62 is changed.

As a result, the position of the shutter 61 where the sputter particles are deposited may be distributed at the time of pre-sputtering of the target 31a or 31b, and thus, the shield life of the shutter 61 may be lengthened.

At this time, the setting of the shutter position setting unit 85 may be performed such that the shutter position at the time of pre-sputtering is changed every specific number (one or two or more) of the substrates. Further, the setting may be set such that the shutter position is changed per pre-sputtering of one substrate.

Next, descriptions will be made on the operation of the sputtering apparatus 100 configured as described above.

First, the substrate S is carried into the vacuum container 2 through the carry-in/out port 23 by a transfer mechanism (not illustrated) provided in a transfer chamber (not illustrated) provided adjacent to the vacuum container 2, and is placed on the stage 4, and the gate valve 24 is closed. Subsequently, the pressure control valve 21a is fully opened and the pressure control in the vacuum container 2 is performed.

When the substrate S is carried into, the shutter 61 is fully closed (in a position closed with respect to both the targets 31a and 31b), and the cover plate 43 is placed at the shielding position. Then, an inert gas from the inert gas supply source 26 of the inert gas supply mechanism, for example, an Ar gas is introduced, and the pressure in the vacuum container 2 is set to, for example, 100 mPa (0.8 mTorr).

In this state, a series of film forming operation is executed. The outline of the series of film forming operation will be described with reference to FIGS. 8A to 8E.

Figure 8A:
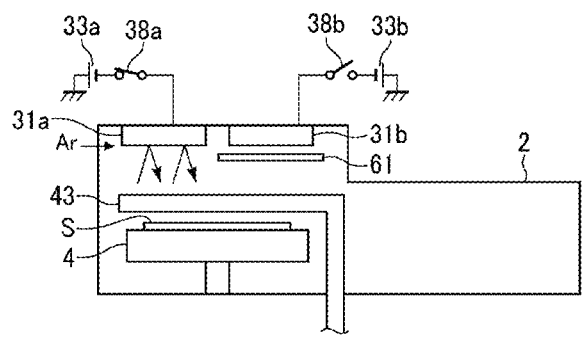
FIG. 8A is a schematic view illustrating a state of the sputtering apparatus when sputtering film formation by a first target is performed.

First, as illustrated in FIG. 8A, sputtering film formation by the first target 31a is performed. As described above, the first target 31a functions as a gettering member, and is made of, for example, Ti.

In this processing, pre-sputtering is performed in a state where the cover plate 43 is positioned at the shielding position, and the first target 31a is shielded by the shielding portion of the shutter 61 at first. Next, the shutter 61 is rotated to open the opening 62 aligned with the first target 31a, and the main sputtering is performed.

At this time, the power source 33a is turned on, and a DC voltage is applied to the target electrode 32a to rotate the magnet array Ma. Therefore, the inert gas (Ar gas) is converted into high-density plasma by the electric field applied to the first target 31a and the magnetic field generated by the magnet array 51a, and the first target 31a is sputtered by the plasma and the target particles (e.g., Ti particles) are knocked and released. The target particles are deposited on the shielding portion of the shutter 61 at the time of pre-sputtering, and are adhered on the side surface of the vacuum container 2 or the upper surface of the cover plate 43 at the time of main sputtering.

The particles, for example, Ti particles, adhered to the inside of the vacuum container 2 by the main sputtering adsorb oxygen molecules or water molecules existing inside the vacuum container 2, and the pressure inside the vacuum container 2 is reduced to, for example, $9 \times 10^{-8}$ Pa. After the sputtering by the first target 31a is performed for, for example, ten seconds, the voltage application to the first target 31a and the supply of the inert gas (Ar gas) are stopped to stop the magnet array 51a, and the shutter 61 is closed.

The pre-sputtering is performed for cleaning the surface of the target before the main sputtering, and for conditioning before the main sputtering.

Figure 8B:
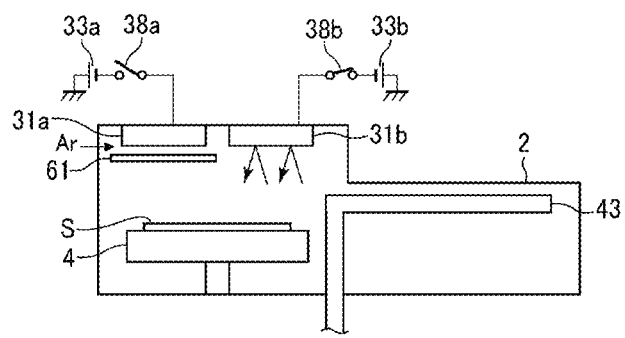
FIG. 8B is a schematic view illustrating a state of the sputtering apparatus when sputtering film formation by a second target is performed.

Next, as illustrated in FIG. 8B, sputtering film formation by the second target 31b is performed. As described above, the second target 31b functions as a film forming material on the substrate S, and is made of, for example, Mg.

In this processing, pre-sputtering is performed in a state where the cover plate 43 is positioned at the retracted position, and the second target 31b is shielded by the shielding portion of the shutter 61 at first. Next, the shutter 61 is rotated to open the opening 62 aligned with the second target 31b, and the main sputtering is performed.

At this time, the power source 33b is turned on, and a DC voltage is applied to the target electrode 32b to rotate the magnet array 51b. Therefore, the inert gas (Ar gas) is converted into high-density plasma by the electric field applied to the second target 31b and the magnetic field generated by the magnet array 51b, and the second target 31b is sputtered by the plasma and the target particles (e.g., Mg particles) are knocked and released. The target particles are deposited on the shielding portion of the shutter 61 at the time of pre-sputtering, and deposited on the substrate S at the time of main sputtering.

A metal film, for example, an Mg film, having a film thickness of, for example, 0.3 nm is formed on the substrate S by performing the main sputtering for, for example, ten seconds. The voltage application to the second target 31b and the supply of the inert gas (Ar gas) are stopped to stop the magnet array 51b, and the shutter 61 is closed.

Figure 8C:
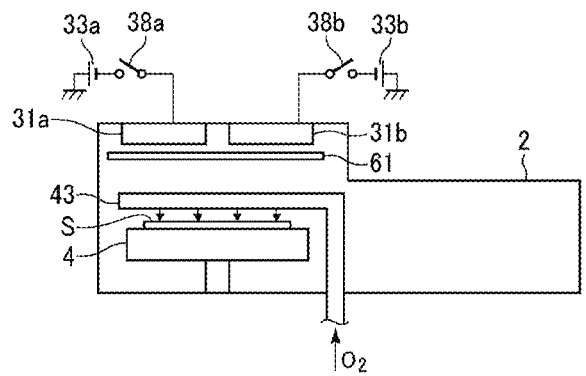
FIG. 8C is a schematic view illustrating a state of the sputtering apparatus when an oxidation treatment of a metal film (Mg film) is performed.

Next, as illustrated in FIG. 8C, an oxidation treatment of the metal film (Mg film) is performed. In the oxidation treatment, the shutter 61 is fully closed (in a position closed with respect to both the targets 31a and 31b), and the cover plate 43 is positioned at the shielding position. Then, the oxygen gas from the oxygen gas supply source 49 is ejected from the gas ejecting port 45 of the cover plate 43 while being preheated by a heater (not illustrated), and is supplied to the surface of the substrate S. By supplying the oxygen gas, the metal film, for example, the Mg film is oxidized to become a metal oxide film, for example, an MgO film.

The formation of the metal film by the sputtering of the second target 31b and the oxidation treatment of the metal film are repeated a plurality of times to form the metal oxide film having a desired film thickness. For example, the MgO film having a film thickness of 0.9 nm is formed by repeating the formation of the Mg film and the oxidation treatment three times.

Figure 8D:
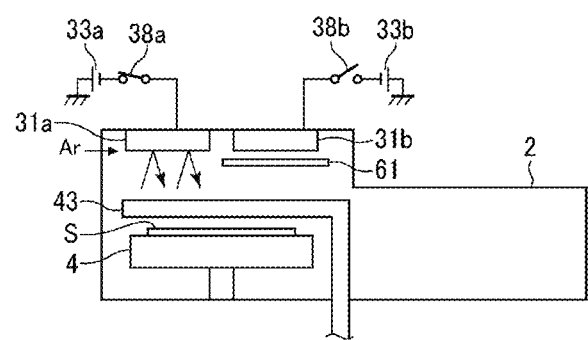
FIG. 8D is a schematic view illustrating a state of the sputtering apparatus when the sputtering film formation by the first target is performed again after the oxidation treatment of the metal film.

After the formation of the metal oxide film is ended, as illustrated in FIG. 8D, the inert gas (Ar gas) is supplied again to perform the sputtering film formation by the first target 31a while the cover plate 43 is kept at the shielding position above the stage 4. The sputtering film formation at this time is performed by the same procedure as the sputtering film formation described with reference to FIG. 8A. Therefore, an excessive oxygen gas on the MgO film of the substrate S and in the vacuum container 2 is removed.

Figure 8E:
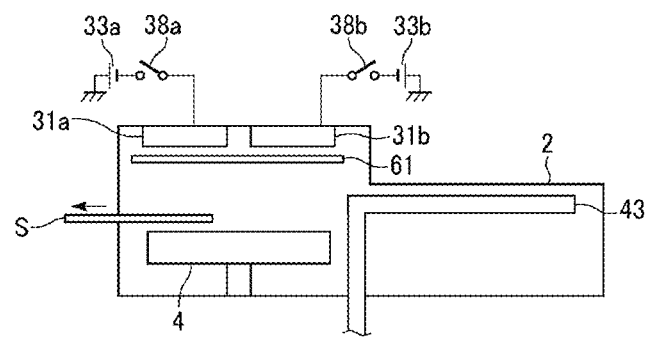
FIG. 8E is a schematic view illustrating a state of carrying out a substrate after a series of processing is ended.

Thereafter, as illustrated in FIG. 8E, the cover plate 43 is retracted from the stage 4 while both the targets 31a and 31b are shielded by the shutter 61, and the gate valve 24 is opened to carry out the substrate S from the carry-in/out port 23.

The above processings of FIGS. 8A to 8E are continuously executed on a plurality of substrates.

The thin metal oxide film (e.g., MgO film) formed by such a method is used, for example, as a part of a magnetic tunnel junction (MTJ) element of a magnetoresistive random access memory (MRAM).

However, in the sputtering apparatus, as described above, the pre-sputtering is performed before the main sputtering. The pre-sputtering is performed for cleaning the surface of the target or conditioning the vacuum container, and since a voltage is actually applied to the target while the shutter is closed, the target material is deposited on the target side surface of the shutter. The deposition amount on the shutter per one pre-sputtering is small, but when the number of processed substrates becomes large, the deposition amount reaches several mm or more. When targets containing a plurality of different materials is mounted, from the viewpoint of preventing cross contamination between the targets, the clearance between the shutter and the shield of the target is generally designed to be several mm to ten and several mm. As a result, when the number of the processed substrates increases, the deposition amount on the shutter becomes larger than the clearance between the shield of the target and the shutter shortly. In this case, friction occurs between the shield and the shutter, which causes particles to be generated, and thus, maintenance is performed when the deposition amount on the shutter exceeds a threshold value.

Figure 9:
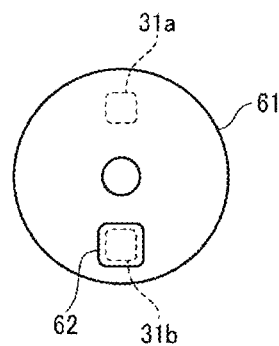
FIG. 9 is a bottom view illustrating a shutter position during pre-sputtering in the related art.
Figure 10:
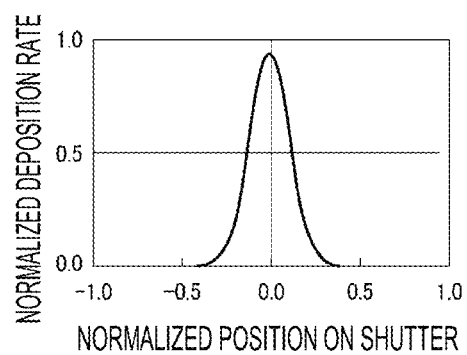
FIG. 10 is a view illustrating a distribution of a deposition rate of a target material deposited on the shutter when the shutter position during pre-sputtering is fixed at one point.

In the related art, the shutter position at the time of pre-sputtering is previously determined. For example, when the pre-sputtering of the first target 31a is performed, for example, as illustrated in FIG. 9, the position of the shutter 61 is fixed to one point at a position where the opening 62 is aligned with the second target 31b. In this case, the deposition of the target material deposited at the time of pre-sputtering is concentrated on one point, and as illustrated in FIG. 10, the distribution of the deposition rate has a maximum value (maximum deposition rate) at a position of the shutter 61 aligned with the vicinity of the center of the first target 31*a*. FIG. 10 illustrates a distribution in a direction passing through the position of the maximum deposition rate of a map illustrating the distribution of the deposition rate of the target material (deposition amount per power amount (kWhr) applied to the target) in a region of the shutter 61 including the first target 31*a*. The vertical axis in FIG. 10 indicates a normalized deposition rate.

However, when a plurality of targets are provided and the processing is performed while the shutter is moved frequently as in the embodiment, the number of times of pre-sputtering is large when processing one substrate, and thus, the shield life of the shutter is shortened in a method in the related art. The shield life is a period until the deposition amount of the target material deposited on the shutter 61 reaches a threshold value requiring maintenance.

Therefore, in the embodiment, it is possible to set a plurality of positions of the shutter 61 when pre-sputtering is performed while the shutter 61 is closed. At each set position of the shutter 61, the position aligned with the target in the shielding portion of the shutter 61 other than the opening 62 is different. Then, as illustrated in FIG. 6 described above, the shutter position setting unit 85 sets the position of the shutter 61 to an arbitrary position among a plurality of settable positions. For example, the setting of the shutter position setting unit 85 is performed such that the shutter position at the time of pre-sputtering is changed every processing of a specific number (one or two or more) of substrates, or the shutter position is changed for the pre-sputtering of one substrate. Then, the shutter controller 86 controls the shutter rotating driving unit 64 based on the setting of the shutter position setting unit 85. Therefore, the shutter 61 is rotated (swung) around the rotary shaft 63, and positioned at the set position among the plurality of settable positions. Then, in the processing of a plurality of substrates S, the pre-sputtering is performed while the position of the shutter 61 is changed. Therefore, the position aligned with the target in the shielding portion of the shutter 61 other than the opening 62 is changed.

By performing such control, the position of the shutter 61 where the sputter particles are deposited may be distributed at the time of pre-sputtering of the target 31*a* or 31*b*, and thus, the shield life of the shutter 61 may be lengthened.

Next, descriptions will be made on an example of a process recipe when a sputtering method including the pre-sputtering and the film forming processing of the embodiment is executed with reference to FIG. 11.

First, while the shutter 61 is closed (CLOSE) with respect to the aligned target, an argon gas is introduced into the vacuum container 2 (Gas in; Step 1). Next, a voltage is applied to the target to ignite the plasma (Ignition; Step 2), and a cleaning processing of the target surface which is first stage pre-sputtering is performed (PreSP1; Step 3) while the plasma discharge is maintained. The voltage at this time is set, for example, higher than the voltage during the film forming processing to enhance the cleaning effect. Next, conditioning which is second stage pre-sputtering is performed with the conditions at the time of film forming processing (PreSP2; Step 4). Thereafter, film formation is performed on the substrate S while the shutter 61 is opened (OPEN) (Depo; Step 5). The time of Step 3 is, for example, five seconds, and the time of Step 4 is, for example, five seconds.

Figure 11:
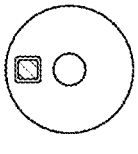
FIG. 11 is a view illustrating an example of a process recipe when a sputtering method according to an embodiment is executed.
Figure 11:
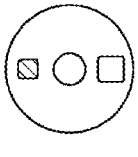
Figure 11:
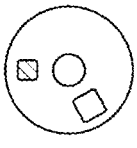
Figure 11:
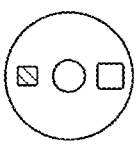
Figure 11:
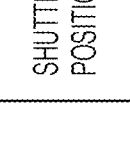

In Steps 2 and 3 among these Steps, the shutter 61 is in a closed state (CLOSED), and also, the shutter 61 is rotated (swung) to be able to acquire a plurality of positions (illustrated as (CLOSE (Multi) in a column of "SHUTTER STATE" in FIG. 11). Although one position is illustrated in a column of "SHUTTER POSITION" for convenience, actually, the shutter is positioned at a specific position among the plurality of positions according to the setting.

In Step 4 which is the second stage pre-sputtering, as the same in Step 1 which is an initial state, the position of the shutter 61 is fixed to the position illustrated in FIG. 9 that is the same as in the related art. This is because, Step 4 is a process in which conditioning is performed immediately before film formation, and the film thickness of a thin metal film formed is uneven when the moving distance of the shutter 61 at the time of film formation is different from the moving distance of the shutter 61 to be opened.

As described above, a plurality of positions of the shutter 61 may be acquired in Steps 2 and 3, and the shutter 61 is swung to change the position of the shutter 61 at the time of pre-sputtering, and thus, the position of the shielding portion of the shutter 61 aligned with the target is changed. Therefore, it is possible to disperse the positions in the shutter 61 where sputter particles are deposited to a plurality of positions. As a result, as compared with the case in the related art where pre-sputtering is performed while the shutter 61 is fixed, the maximum deposition rate may be small, and the shield life of the shutter 61 may be extended.

Figure 12:
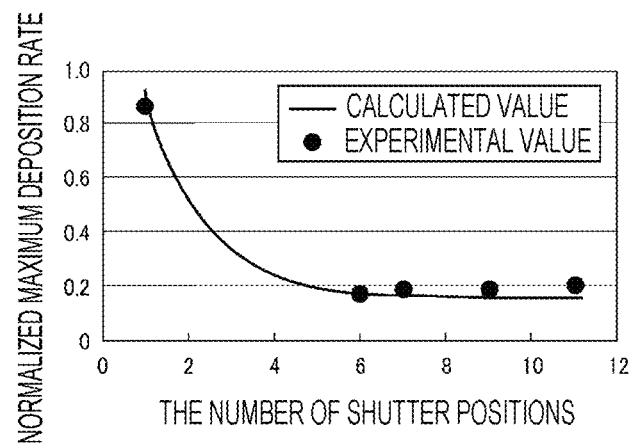
FIG. 12 is a view illustrating a relationship between the number of the shutter positions and a maximum deposition rate as calculated values and experimental values.

At this time, the maximum deposition rate may be reduced by increasing the number of settings of the shutter position when the pre-sputtering is performed while the shutter 61 is closed. FIG. 12 is a view illustrating a relationship between the number of the shutter positions and the maximum deposition rate, which illustrates calculated values and experimental values. Here, when there is a plurality of shutter positions, and Steps 1 to 5 are performed with respect to a plurality of substrates, the results obtained by performing pre-sputtering so that the deposition rate at each position in Steps 2 and 3 is uniform are illustrated. In FIG. 12, the vertical axis indicates the normalized maximum deposition rate, the calculated values are illustrated by a line, and the experimental values are illustrated by a plot of ●. As illustrated in this drawing, the calculated values and the experimental values substantially coincide with each other, and there is a plurality of shutter positions, and the position in the shielding portion of the shutter 61 aligned with the target is dispersed to a plurality of points, the maximum deposition rate is rapidly reduced. Then, as compared with the case where the number of the shutters is one, and the position aligned with the target is one, it may be seen that the maximum deposition rate becomes ½ or lower when the number of the shutter positions is three or more, and the maximum deposition rate becomes ¼ or more when the number of the shutter positions is six or more. Then, it may be seen that the reducing of the maximum deposition rate is almost saturated when the number of the shutter positions is six.

Figure 13:
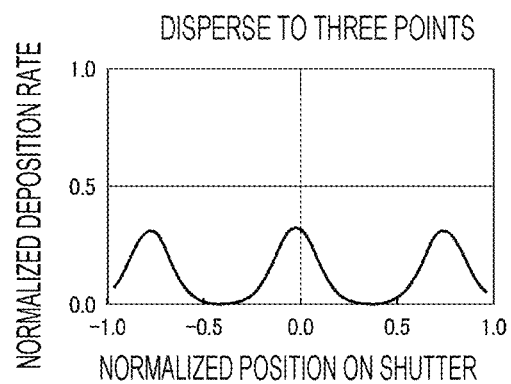
FIG. 13 is a view illustrating a distribution of a deposition rate on the shutter when the number of the shutter positions is three, and there are three points aligned with a target in a shielding portion of a shutter 61.
Figure 14:
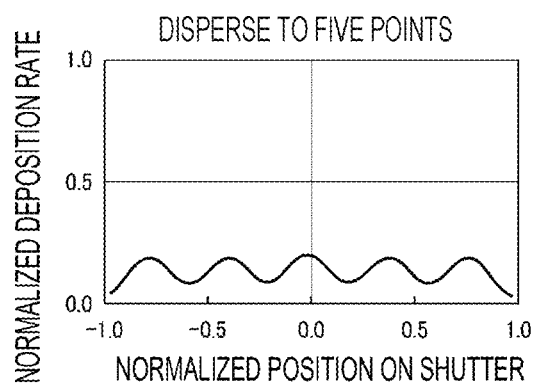
FIG. 14 is a view illustrating a distribution of a deposition rate on the shutter when the number of the shutter positions is five, and there are five points aligned with a target in a shielding portion of the shutter 61.
Figure 15:
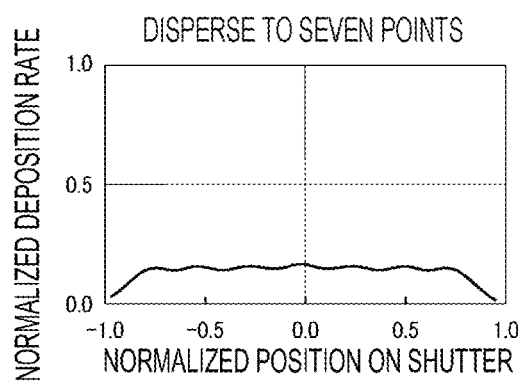
FIG. 15 is a view illustrating a distribution of a deposition rate on the shutter when the number of the shutter positions is seven, and there are seven points aligned with a target in a shielding portion of the shutter 61.

The distributions (calculated values) of the deposition rate on the shutter when the number of the shutter positions is three, five, and seven, and the positions in the shielding portion of the shutter 61 aligned with the target are three points, five points, and seven points are illustrated in FIGS. 13, 14, and 15, respectively. In the drawings, the vertical axis indicates a normalized deposition rate. As illustrated in the drawings, it may be seen that each position of the shutter aligned with the target indicates a peak (maximum deposition rate), and the peak height becomes lower as the number of the shutter positions increases in all drawings. Then, when the number of the shutter positions is seven, the peak is substantially invisible.

From the above results, the number of the shutter positions may be three, and furthermore, may be six.

For example, in the above embodiment, the gettering material and the material for forming a film on the substrate are listed as the target material, and a plurality of materials are illustrated for them. However, the present disclosure is not limited thereto, and various materials may be used for various purposes such that both of them are materials for forming a film on the substrate. Further, in the above embodiment, an oxidation treatment is performed after the metal film is formed on the substrate, but the oxidation treatment may not be performed.

Further, in the above embodiment, an example in which two targets are provided is illustrated. However, the number of the targets is not limited thereto, and may be one or three or more, as long as a shutter capable of opening/closing is provided close to the target.

Further, the apparatus in the above embodiment is merely illustrative, and the structure of the apparatus is not limited as long as a shutter capable of opening/closing is provided close to the target. For example, the apparatus in the above embodiment includes an oxidizing gas introducing mechanism configured to oxidize a metal film, but may simply form a metal film without providing the oxidizing gas introducing mechanism. The sputtering method is also illustrative, and other sputtering methods may be used.

According to the present disclosure, a film forming method and a film forming apparatus capable of extending shield life of a shutter, when a processing in which pre-sputtering is performed while the shutter close to a target is closed and main sputtering is performed while the shutter is opened is repeated, are provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A sputtering method comprising:
performing a pre-sputtering by emitting sputter particles from a target provided in a sputtering apparatus in a state where the target is shielded by a shielding portion of a shutter provided close to the target to be capable of opening/closing the target; and
after the pre-sputtering, performing a main-sputtering by emitting the sputter particles from the target in a state where an opening of the shutter is aligned with the target thereby depositing the sputter particles on a substrate,
wherein, when the pre-sputtering and the main-sputtering are repeatedly performed, a shutter position is changed during the pre-sputtering so as to change a position of the shielding portion aligned with the target in the state where the target is shielded by the shielding portion, and
the shutter is a single shutter.

2. The sputtering method according to claim 1, wherein, during the pre-sputtering, the shutter is swung to change the shutter position so as to change the position of the shielding portion aligned with the target.

3. The sputtering method according to claim 1, wherein a plurality of shutter positions is set, and a shutter position is selected from the plurality of shutter positions when the pre-sputtering is performed.

4. The sputtering method according to claim 3, wherein the number of the plurality of shutter positions is three or more.

5. The sputtering method according to claim 4, wherein the number of the plurality of shutter positions is six or more.

6. The sputtering method according to claim 1, wherein, in the main-sputtering, the sputter particles are deposited to form a film on the substrate, and the pre-sputtering and the main-sputtering are repeatedly performed on a plurality of substrates.

7. The sputtering method according to claim 6, wherein the shutter position is changed during the pre-sputtering for each processing of a specific number of substrates.

8. The sputtering method according to claim 6, wherein the shutter position is changed during the pre-sputtering for one substrate.

9. The sputtering method according to claim 1, wherein a plurality of targets is provided, and the shutter shields the plurality of targets other than a target on which the main-sputtering is performed.

10. The sputtering method according to claim 9, wherein the plurality of targets include a target made of a getter material and a target made of a material used to form a film on the substrate.

11. A sputtering apparatus comprising:
a vacuum container configured to be kept in a vacuum and accommodate a substrate therein;
a target disposed inside the vacuum container;
a shutter provided close to the target and configured to open/close the target;
a sputter particle emitter configured to emit sputter particles from the target; and
a controller configured to control an overall operation of the sputtering apparatus,
wherein the controller is configured to control the sputter particle emitter to repeatedly performs a pre-sputtering by emitting sputter particles from the target in a state where the target is shielded by a shielding portion of the shutter and a main-sputtering, after the pre-sputtering, by emitting the sputter particles from the target in a state where an opening of the shutter is aligned with the target thereby depositing the sputter particles on a substrate,
wherein the controller is configured to, when the pre-sputtering and the main-sputtering are repeatedly performed, change a shutter position during the pre-sputtering so as to change a position of the shielding portion aligned with the target in the state where the target is shielded by the shielding portion and
the shutter is a single shutter.

12. The sputtering apparatus according to claim 11, wherein the controller controls the pre-sputtering such that the shutter is swung to change the shutter position, so as to change the position of the shielding portion aligned with the target.

13. The sputtering apparatus according to claim 11, wherein the controller sets a plurality of shutter positions, and selects a shutter position from the plurality of shutter positions during the pre-sputtering.

14. The sputtering apparatus according to claim 13, wherein the number of the plurality of shutter positions is three or more.

15. The sputtering apparatus according to claim 14, wherein the number of the plurality of shutter positions is six or more.

16. The sputtering apparatus according to claim 11, wherein the controller controls the main sputtering such that the sputter particles are deposited to form a film on the substrate, and repeatedly executes the pre-sputtering and the main-sputtering on a plurality of substrates.

17. The sputtering apparatus according to claim 16, wherein the controller changes the shutter position during the pre-sputtering for each processing of a specific number of substrates.

18. The sputtering apparatus according to claim 16, wherein the controller changes the shutter position during the pre-sputtering for one substrate.

19. The sputtering apparatus according to claim 11, wherein a plurality of targets is provided, and the shutter shields the plurality of targets other than a target on which the main-sputtering is performed.

20. The sputtering apparatus according to claim 19, wherein the plurality of targets include a target made of a getter material and a target made of a material used to form a film on the substrate.

* * * * *